United States Patent [19]
Kalfus et al.

[11] Patent Number: 4,935,803
[45] Date of Patent: Jun. 19, 1990

[54] SELF-CENTERING ELECTRODE FOR POWER DEVICES

[75] Inventors: Martin Kalfus, Scottsdale; Robert A. Gooch, Mesa, both of Ariz.

[73] Assignee: Motorola, Inc., Schaumburg, Ill.

[21] Appl. No.: 242,926

[22] Filed: Sep. 9, 1988

[51] Int. Cl.$^5$ ...................... H01L 23/48; H01L 29/44
[52] U.S. Cl. ........................................ 357/68; 357/69; 357/70
[58] Field of Search ............................ 357/68, 69, 70; 437/180, 182; 29/827, 854, 857; 361/401

[56] References Cited

U.S. PATENT DOCUMENTS

| | | | |
|---|---|---|---|
| 3,290,564 | 12/1966 | Wolff, Jr. | 317/234 |
| 3,365,620 | 1/1968 | Butler et al. | 361/401 |
| 3,374,533 | 3/1968 | Burks et al. | 361/401 |
| 3,478,420 | 12/1968 | Grimes et al. | 29/588 |
| 3,500,136 | 1/1968 | Fischer | 317/234 |
| 3,569,797 | 3/1971 | Simmons | 317/234 |
| 3,763,403 | 3/1972 | Lootens | 317/234 |
| 3,869,787 | 3/1975 | Umbaugh | 357/69 |
| 3,997,963 | 12/1976 | Riseman | 357/69 |
| 4,012,765 | 3/1977 | Lehner et al. | 357/70 |
| 4,117,508 | 9/1978 | Koenig | 357/81 |
| 4,158,745 | 6/1979 | Keller | 174/52 |
| 4,252,864 | 2/1981 | Coldren | 428/571 |
| 4,346,396 | 8/1982 | Carroll, II et al. | 357/70 |

FOREIGN PATENT DOCUMENTS 3528427 4/1987 Fed. Rep. of Germany ........ 357/70
8802929 4/1988 World Int. Prop. O. ............ 357/70

OTHER PUBLICATIONS

*IBM TDB*, Hayunga et al., vol. 9, No. 11, Apr. 1967, p. 1653, "Serrated . . . Chip Devices".

*Primary Examiner*—Jerome Jackson, Jr.
*Attorney, Agent, or Firm*—Robert M. Handy

[57] ABSTRACT

An improved means and method for forming leads to a power device is provided by use of a one-piece leadframe on which the die is mounted and a separate connecting clip between the leadframe and the bonding pad on the semiconductor die. The leadframe has an alignment dimple or groove for receiving a mating alignment feature on one end of the connecting clip. The other end of the connecting clip is located over the bonding pad on the die. Solder is placed between die and the leadframe and between the connecting clip and the bonding pad and between the mating alignment surfaces on the clip and leadframe. When the solder is liquid during assembly the die and clip float thereon and automatically align by surface tension so that the die is centrally located on the die flag, the connection point on the clup is centered on the bonding pad and the mating alignment surfaces on the clip and leadframe are engaged. The self-aligning process is dominated by the mating alignment regions on the connecting clip and leadframe which have a larger area and solder wetted periphery than the other regions being soldered.

9 Claims, 3 Drawing Sheets

SELF-CENTERING ELECTRODE FOR POWER DEVICES

BACKGROUND OF THE INVENTION

1. Field of the Invention

This invention relates in general to electronic devices and, more particularly, to improved means and methods for providing leads to semiconductor or other electronic chips. As used herein the words device or devices are intended to refer to all kinds of electronic devices and integrated circuits which use connection means and leads of the sort described herein, including but not limited to semiconductor based devices.

2. Background Art

In the electronics art, particularly the semiconductor device and circuit art, it is commonplace to provide light weight leads to devices that primarily function for signal processing and heavy leads to devices that carry substantial current. Wire bonding of thin wires and tab bonding of metal foils are examples of techniques commonly used for signal processing devices. Such wires or foils generally carry only microamperes or milliamperes, are typically a fraction of a mil to a few mils thick, and are generally welded directly to the bonding pads on the device.

With higher current devices, such as power diodes and transistors or integrated circuits where currents of amperes to tens or hundreds of amperes are required, the leads bonded to the device must be more robust. It is commonplace to use metal leads that are of the order of ten to hundreds of mils thick. They are frequently attached by soldering to the bonding areas on the device.

When such robust leads are required, it becomes increasingly difficult to align the leads with the bonding pads on the die or other electronic device and to maintain such alignment during the bonding process. If the leads and bonding pads on the die are misaligned, then manufacturing yield and reliability are reduced.

Accordingly, it is an object of the present invention to provide an improved means and method for fabricating power devices wherein at least one of the leads is self-aligning with respect to a lead frame and the bonding pad on the die to which the lead is to be attached.

It is a further object of the present invention to provide an improved means and method for fabricating power devices wherein the die is mounted on a leadframe and a connection to a bonding pad on the device is provided by a self-aligning contact clip which bridges between the die and another part of the leadframe.

It is an additional object of the present invention to provide an improved means and method for fabricating power devices wherein the leadframe and the self-aligning contact clip have mating surfaces for aligning the clip with respect to the leadframe during assembly.

It is a further object of the present invention to provide an improved means and method for fabricating power devices wherein the self-aligning contact clip partially floats temporarily during assembly on electrical coupling materials for connecting it to the die and to the leadframe.

It is a further object of the present invention to provide an improved means and method for fabricating power devices wherein the die also floats during assembly and self-aligns with respect to the contact clip and the die mount portion of the leadframe.

It is an additional object of the present invention to provide an improved means and method for fabricating power devices wherein self-alignment is automatic.

As used herein the words solder or solders are intended to include any electrically conductive attachment material which is semi-solid or at least partially liquid at some time during the lead attachment process. Nonlimiting examples are conventional metal or metal alloys or metal loaded epoxies or other conductive plastics and the like.

As used herein, the words chip or die are intended to refer to electronic elements such as but not limited to diodes, transistors, thyristors, integrated circuits, resistors, capacitors and the like having at least one bonding region or pad thereon.

SUMMARY OF THE INVENTION

The attainment of the foregoing and other objects and advantages is achieved through the present invention comprising an electronic chip having a first surface for attachment to a lead means and a second surface with a bonding pad thereon for receiving a connection means, a lead means having a first portion for receiving the electronic chip and a second portion including a first alignment means for alignment of the connection means, and a connection means for connecting the lead means to the electronic chip, wherein the connection means has a first portion for coupling to the bonding pad and a second portion with a second alignment means which mates with the first alignment means for aligning the connection means between the lead means and the bonding pad.

It is desirable to attach the bonding pad to the first portion of the connection means with a first solder, to attach the first and second alignment means with a second solder, and to attach the electronic chip and the first portion of the lead means with a third solder. The first, second and also preferably the third solders should have a controllable state during which the solders are at least partially liquid so that the die and connection means may be floated thereon to self-align to each other and to the lead means.

The first portion of the connection means is supported by the bonding pad and the second portion of the connection means is supported by the first alignment means. The first and second alignment means conveniently have the form of mating depressions or protrusions in, respectively, the lead means and the connection means. The mating depressions or protrusions are preferably of such a shape as to allow lateral or longitudinal motion or vertical rotation of the connection means with respect to the lead means, but not permit horizontal rotation of the connection means.

A device, such as is described above and containing an electronic element therein, is conveniently obtained by steps comprising, supplying a support member for receiving the electronic element, supplying a lead member having a first alignment means for receiving a connection means with a mating second alignment means therein for mutually aligning the lead member and the connection means, supplying the connection means with the second alignment means for mating with the first alignment means and having a first attachment means for coupling to the electronic element, providing a first bonding material between the support member and the electronic element, providing a second bonding material between the first and second alignment means, and providing a third bonding material between the attachment means and the electronic element, temporarily floating the connection means on the second and third bonding material, and thereafter solidifying the second and third bonding material.

The first bonding material may be provided before the second or third bonding material or simultaneously with the second bonding material or the second and third bonding materials maybe provided simultaneously.

It is desirable to temporarily float the electronic element on the first bonding material at the same time as the connection means is floated on the first and second bonding materials so that the electronic element and the connection means align with each other and with the support member and lead member, controlled by the alignment means on the lead member and the connection means.

It is desirable to provide the first alignment means as a first depression or protrusion in the lead member and the second alignment means as a mating second depression or protrusion in the connection means, further, place the second alignment means in the first alignment means separated by the second bonding material where they are retained by gravity and surface tension until the second bonding material is solidified. It is further desirable to agitate at least the support member during the floating step.

The arrangement of the lead member, support member and connection means, and the choice of and the relative amounts of the three bonding materials should be such that the surface tension forces in the liquified bonding materials align the connection means to the lead member, center the bonding pad on the die under the attachment portion of the connection means, and substantially center the die and attachment portion of the connection means above the die bond region of the die support member. This provides automatic alignment of the parts.

The foregoing and other objects and advantages will be better appreciated and a fuller understanding of the invention obtained by considering the accompanying drawings and explanation that follows.

BRIEF DESCRIPTION OF THE FIGURES

FIG, 6 is a top and partial cutaway view

DETAILED DESCRIPTION OF THE FIGURES

Figure 1:
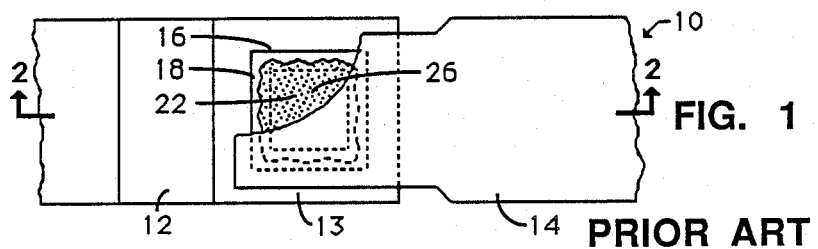
FIG. 1 is a top and partial cut-away view and FIG. 2 is a partial cross-sectional view, as indicated on FIG. 1, of a portion of an electronic device according to the prior art.
Figure 2:
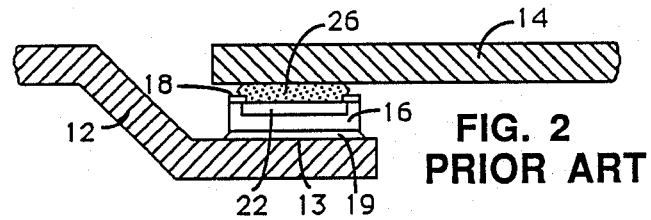

FIGS. 1 shows a partial cut-away top view and FIG. 2 shows a cross-sectional view of portion 10 of a prior art electronic device, for example a semiconductor device, comprising die support means 12 having die bond region 13, electronic die (e.g., semiconductor chip) 16, and conductive electrode 14. Die support lead 12 and contact lead 14 are typically made of metals well known in the art. Copper is an example.

Die 16 is attached to support 12 by attachment means 19. Contact 22 on die 16 is bonded to lead 14 by bonding material 26, for example, a solder. In the example shown, die 16 has raised dielectric 18 surrounding contact 22, but this is not essential.

Where die 16 is a semiconductor power device or other electronic element which must handle a current of an ampere to hundreds of amperes, die support 12 and lead 14 are generally made of comparatively thick metals, as for example, copper or Kovar TM or other metals having thicknesses in the order of 10 to hundreds of mils (0.25 to several millimeters). Such leads are comparatively stiff and alignment of the die flag, the die and the contact lead can be a problem in manufacturing. Further the prior art arrangement shown in FIGS. 1–2 has the additional disadvantage that it promotes run-out of solder 26 onto the upper surface of dielectric 18, which is undesirable for good manufacturing yield and reliability.

The prior art arrangement of FIGS. 1–2 is also difficult to assemble since leads 12 and 14 must overlap with die 16 in between. In these circumstances, after die 16 is mounted on die flag 13, lead 14 must either be folded over from another part of the leadframe or provided separately. Both operations require additional steps and care must be taken to properly align lead 14 above die 16 and die flag 13.

Figure 3:
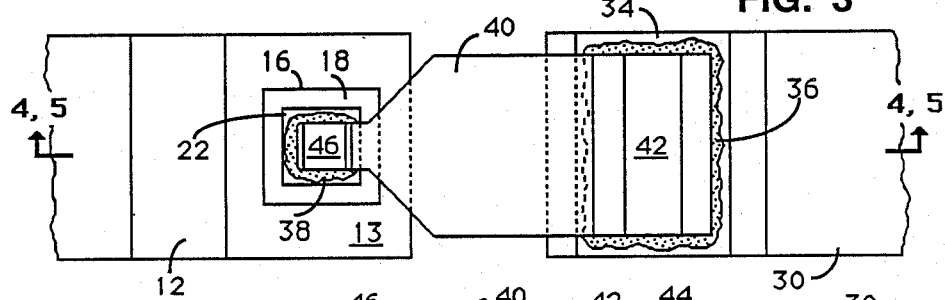
FIG. 3 is a top view and FIGS. 4–5 are partial cross-sectional views, as indicated on FIG. 3, of a portion of an electronic device according to the present invention.
Figure 4:
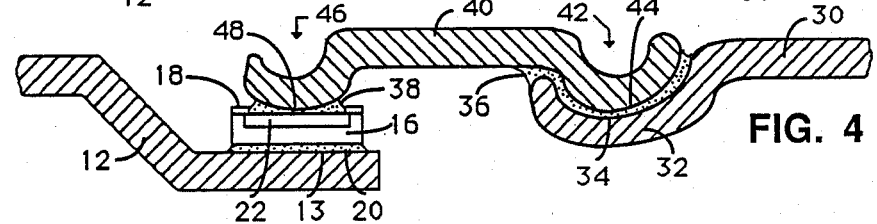
Figure 5:
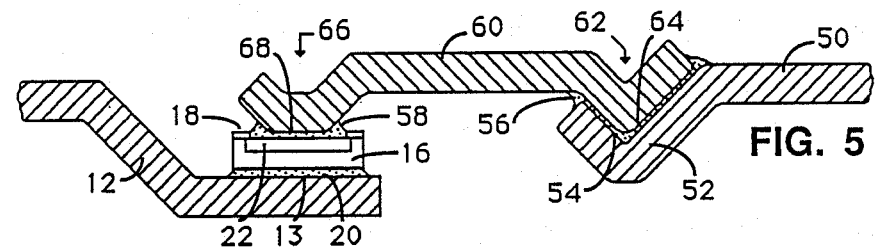

These and other problems of the prior art are avoided by the present invention, a first embodiment of which is illustrated in top view in FIG. 3 and in cross-sectional view in FIG. 4. FIG. 5 is a cross-sectional view similar to FIG. 4 but illustrating a further embodiment.

Referring now to FIGS. 3–5, die 16 having contact region 22 surrounded, for example, by raised dielectric 18, is mounted on die flag 13 by attachment means 20. Attachment means 20 may be conductive or insulating, but conductive solder is frequently used when die support 12, 13 is also intended to serve as one of the electrical leads of the device coupled to die 16.

Lead 30, 50 is provided extending toward die 16 and is intended to serve as an external connection to die 16. Conveniently located near the end of lead 30, 50 closest to die 16 is alignment means 32, 52. In the example shown in FIGS. 3–5, alignment means 32, 52 has the shape of a depression in lead 30, 50 but other shapes such as a protrusion could also be used. In FIGS. 3–4, alignment means 32 has the shape of a substantially hemi-cylindrical groove or other rounded two dimensional shape whose long dimension extends transverse to the direction from lead 30 toward die 16. In FIG. 5, alignment means 52 has a the shape of a two dimensional notch or fold-like depression whose long dimension extends transverse to the direction from lead 50 toward die 16. While alignment means 32, 42 and 52, 62 are shown as being convex downward, they could also be convex upward, i.e., bumps or protrusions rather than depressions.

Referring still to FIGS. 3–5, connection means or clip 40, 60 extends from lead 30, 50 to contact region 22 on die 16. Connection clip or means 40, 60 has alignment means 42, 62 at a first end which mates with alignment means 32, 52 of lead 30, 50 and, at a second end, has attachment means 46, 66 which is coupled to die contact or bonding pad 22. The shapes of alignment means 42, 62 are such that they engage alignment means 32, 52. As can be seen in FIG. 3, the groove shaped depressions of alignment means 32, 52 and 42, 62 permit connection means 40, 60 to move transverse to the direction extending from lead 30, 50 toward die contact 22 on die 16, but restrain movement of clip 40, 60 relative to lead 30, 50 and die contact 22 in the direction toward die contact 22 and restrain horizontal (azimuthal) rotation of connection means 40, 60 relative to lead 30, 50 or bonding pad 22 in the plane of FIG. 3. However, connection means 40, 60 is able to rotate during assembly in the vertical plane, that is in the plane of FIGS. 4–5. This is desirable since it permits substantial variations in the thickness of die 16 to be accommodated with no change in the leadframe or connection means. This simplifies manufacturing. The configuration shown in FIG. 4 is particularly useful for this purpose because the nested curved surfaces of alignment means 32, 42 form a rotary hinge which permits vertical rotation of connection means 40 relative to lead 30 without substantial change in the spacing of alignment means 32, 42. In this respect it is also desirable that the end of connection means 40 which attaches to bonding pad 22 also be curved, as illustrated by attachment means 46 in FIG. 4.

Connection means 40, 60 has attachment means 46, 66 for making connection to die contact or bonding pad 22. FIG. 4 illustrates the situation where attachment means 46 has bottom 48 which is slightly rounded and FIG. 5 illustrates the situation where die attachment means 66 has bottom 68 which is substantially flat. In both cases it is desirable that attachment means 46, 66 be convexly shaped toward die contact 22 so as to prevent solder encroachment onto the upper surface of dielectric 18. This is explained more fully in co-pending application to Kalfus et al., entitled "Formed Top Contact for Non-Flat Semiconductor Devices," Ser. No. 243,363, which is incorporated herein by reference. Attachment means 46, 66 may be hemi-cylindrical or other substantially two dimensional shape or may be hemi-ellipsoidal or other substantially three dimensional shape, as explained in Kalfus et al., supra.

Connection clip 40, 60 is attached to lead 30, 50 by attachment or bonding material 36, 56 and to die contact 22 by attachment or bonding material 38, 58. Electrically conductive solders are examples of suitable attachment or bonding materials. It is important that materials 36, 56 and 38, 58 be capable of being liquified or maintained as liquids, at the same time. It is desirable that die bonding material 20 also have the property of being liquid at the same time as materials 36, 56 and 38, 58. While bonding material 20 may be an electrically conductive material, this is not essential, since in many cases, other electrical contact may be made to terminals (not shown) elsewhere on the die.

Where materials 20, 36, 56, and 38, 58 are solders, then it is desirable to choose solders which have a common liquification or melting temperature. Where one of more of these attachment or bonding materials are glasses or plastics, whether electrically conductive or not, it is important that they be temporarily, at least partially liquid at the same time during assembly that the other, electrically conductive bonding materials are also liquid or partially liquid. In other words, it is important that the attachment or bonding materials have a common state, e.g., a temperature range or curing or bonding condition or the like, where they are semi-solid or at least partially liquid.

It is not essential that perfect liquidity of the bonding materials be achieved (although that is desirable). At a minimum, the bonding materials should be sufficiently liquid that the connection clip (and desirably also the die) can float on the semi-solid or partially liquid bonding material and be free to move laterally with respect to leads 12 and 30, 50. As will be subsequently explained in more detail, after leads 12 and 30, 50, and die 16 and clip 40, 60 have been assembled with the various bonding materials therebetween, the bonding materials are temporarily liquified or temporarily maintained as liquids to permit clip 40, 60 to float on liquified bonding materials 36, 56 and 38, 58 and to permit die 16 to float on liquified bonding material 20, so that the die, clip and leads self-align by surface tension and the action of the mating alignment means. While best results are obtained when the die bonding material as well as the connection clip bonding materials are simultaneously liquid, some improvement is obtained with just connection clip bonding materials simultaneously liquid.

With respect to the choice of solder material it is found that metal alloy solders are particularly suitable but other solders are also believed to be useful. In choosing a solder it is important to choose materials that readily wet the electrical leads and which do not readily wet regions of the die adjacent to the bonding location where contact with the leads or solder is not wanted. Since the electrical leads are usually of high conductivity metals and adjacent die regions are often covered by a passivation dielectric, solders which preferentially wet such metals and do not significantly wet passivation dielectrics are preferred in such locations. In these circumstances metal alloy solders usually perform better than most conductive plastics or glasses of which we are aware.

Figure 6:
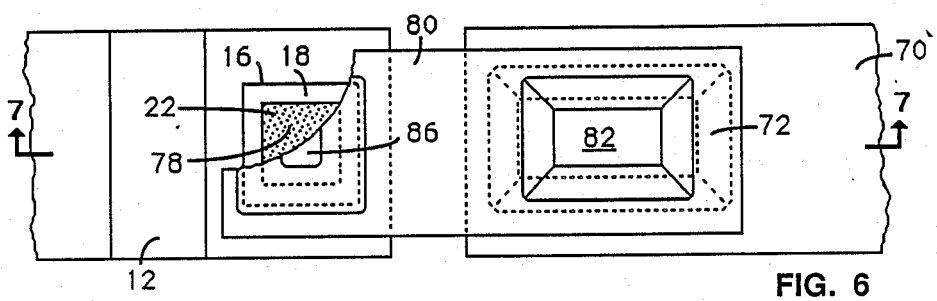
Figure 7:
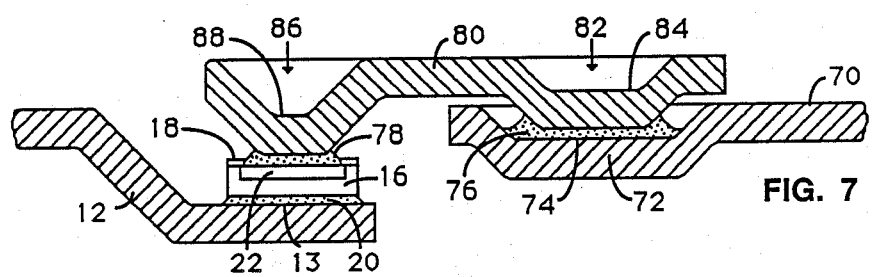
FIG. 7 is a partial cross-sectional view, as indicated in FIG. 6, of a portion of an electronic device according to a further embodiment of the present invention.
Figure 8:
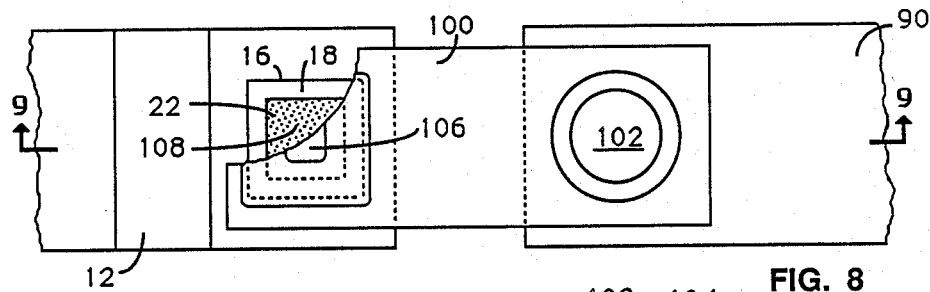
FIG. 8 is a top and partial cutaway view and FIG. 9 is a partial cross-sectional view, as indicated in FIG. 8, of a portion of an electronic device according to a still further embodiment of the present invention.
Figure 9:
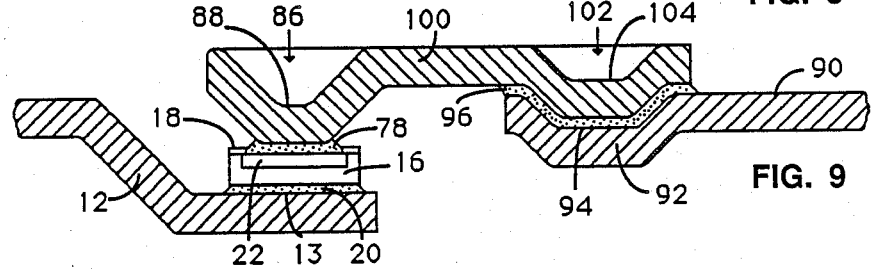

FIGS. 6–9 show further embodiments of the present invention. FIGS. 6 and 8 are partial cut-away top views similar to FIG. 3 and FIGS. 7, 9 are cross-sectional views similar to FIGS. 4–5. In FIGS. 6 and 8, die 16 is mounted on die flag 13 of support member 12 by bonding material 20. Die 16 has upward facing contact region or bonding pad 22, as before.

Connection clip 80, 100 bridges between lead 70, 90 and bonding pad 22. As shown in FIGS. 6–7, lead 70 has alignment means 72 in the form of a depression with a long dimension directed toward die 16 and bonding pad 22. Mating alignment means 82 in clip 80 has bottom and sides 84 which engage bottom and sides 74 of alignment means 72. However, alignment depression 82 is shorter than alignment depression 72 so that connection clip 80 may move in the direction of bonding pad 22 but not transversely to such direction or azimuthally with respect to lead 70 and pad 22. By making alignment means 72 and 82 of substantially the same length as well as width, then relative motion between lead 70 and connection clip 80 is precluded in any direction. Alignment means 72 and 82 are joined by electrically conductive bonding material 76, as for example a solder.

Connection clip 80 has dimple or convex downward formed region 86 having bottom 88 for bonding to pad 22 by means of bonding material 78. Bottom 88 may be substantially flat or rounded. FIGS. 6–9 illustrate the situation where attachment region 86 extends laterally beyond pad 22. When this is the case, it is important that region 86 be dimpled, i.e., convexly shaped toward pad 22, so as to provide increasing separation between lower surface 88 and the upper surface of dielectric 18 as one moves laterally away from the center of bonding pad 22. This prevents solder run-out or creep onto the upper surface of dielectric 18, This is explained more fully in the co-pending application of Kalfus et al., supra.

FIGS. 8-9 show a further embodiment of the present invention in which mating alignment means 92 and 102 in lead 90 and connection clip 100 have substantially circular symmetry. Bottom and sides 94 of alignment dimple 92 mate with bottom and sides 104 of alignment dimple 102. This arrangement permits angular movement between clip 100 and lead 90, but no lateral displacement. Lead 90 and clip 100 are joined by electrically conductive bonding material 96.

From the foregoing description, it will be apparent that the degrees of freedom of relative movement permitted by the alignment means may be selected to correspond to the types of die placement and lead alignment errors most likely to be found in production. Those of skill in the art will understand, based on the description herein and their own individual circumstances, which of the several embodiments illustrated best suits their requirements.

EXAMPLE

Figure 10:
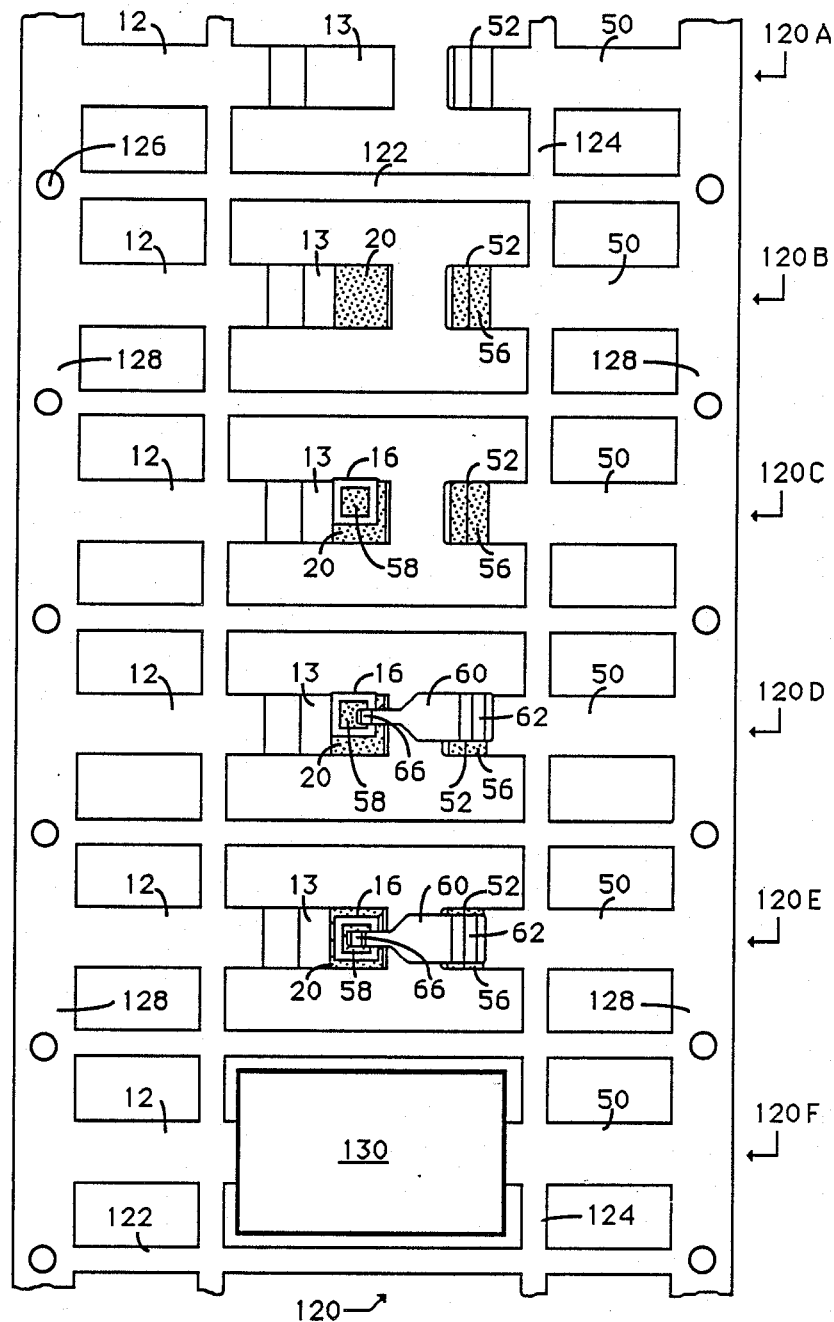
FIG. 10 is a top plan view of a portion of an electronic leadframe having multiple sections and showing and example of the method of the present invention.

FIG. 10 illustrates the method of the present invention. Leadframe 120 is shown as having separate sections 120A-F. Each section illustrates a step for preparing a finished electronic device according to the present invention. As those of skill in the art will appreciate, in actual practice sections 120A-F, of leadframe 120 would all undergo the different steps as a group. Showing a different step at each of the positions 120A-F is merely for simplicity of explanation.

Samples were built using silicon rectifier die having lateral dimensions in the range of about 37×37 to 105×105 mils (0.94 to 2.7 mm square) with a raised dielectric periphery as described in Kalfus et al., supra. Bonding pad 22 was typically in the range of about 29 to 94 mils (0.74 to 2.4 mm) square.

Leadframe 120 corresponds to the configuration shown in FIGS. 3 and 5 but, as those of skill in the art will appreciate, this is merely for convenience of explanation and not intended to be limiting and any of the described lead and connection clip configurations or equivalents can also be used. Leadframe 120 has conventional dam bars 122, 124 and indexing holes 126 in side rails 128.

At 120A, die support member 12 having die bonding region 13 and lead 50 having alignment means 52 are provided. In the parlance of the art, region 13 is referred to as the die flag. In the illustrated arrangement it is assumed that electrical contact to one side of electronic die 16 is to be made by lead 12, 13. However, as those of skill in the art will appreciate, this is not essential and lead 12, 13 may serve merely as a mechanical support or thermal connection for die 16. Die flag 13 is typically 80×90 to 115×135 mils (2.0×2, 2 to 2.9×3.4 mm). Leadframe 120 typically has a thickness in the range 5 to 15 mils (0.13 to 0.38 mm) or larger.

At 120B, die bonding material 20 is applied to die flag 13. Die bonding material 20 is conveniently a solder paste or solder preform. Solder paste having a composition of 88:10:2 (Pb:Sn:Ag) is suitable for use with silicon semiconductor die, but other well known die bonding materials may also be used. Solder paste in the amount of about 0.5 to 3.0 milligrams is dispensed onto die flag 13 gives satisfactory results for die bonding material 20, but larger or smaller amounts may also be used. The same solder paste and similar amounts is used for bonding material 56 and 58, taking into account the relative sizes of the different bonding areas.

At 120C, die 16 is placed on die bonding material 20 with or without lead bonding material 58. Lead bonding material 58 may be provided as a part of the manufacture of die 16 or later. Die 16 is deliberately shown as being slightly misaligned on die flag 13 to illustrate the subsequent self-aligning action of the invented structure and method.

If bonding material 56, 58 are not already present they are conveniently applied now. Solder paste of the composition previously described and in generally similar or smaller amounts, depending on the size of bonding pad 22, is suitable for both bonding material 56 and 58.

In position 120D, connection clip 60 is placed in position on bonding material 56, 58. Copper connection clips 60 having a thickness in the range 5 to 15 mils (0.13 to 0.48 mm) or thicker are suitable. It is desirable that bonding pad attachment region 66 be about 5–15 mils (0.13 to 0.38 mm) narrower than bonding pad 22. Clip 60 and alignment regions 62 may be slightly narrower than lead 50 but this is not essential. Although not illustrated here, clips of the type illustrated in FIGS. 6–9 are also believed to give good results.

Alignment means 62 rests on bonding material 56 on alignment means 52, and attachment means 66 rests on bonding material 58 on contact 22. Perfect positioning of die 16 and connection clip 60 is not required. In 120D, connection clip 60 is deliberately shown as being slightly misaligned with respect to die 16 and lead 50 to illustrate the subsequent self-aligning action of the invented structure and method.

When the assembled die, connection clip, leadframe and solder bonding materials therebetween are heated, die 16 floats on solder 20, clip 60 floats on solder 56, 58 and groove 62 engages groove 52. For the above-described solder paste, a peak temperature of about 340° C. for a time of about three minutes is sufficient. A twenty foot long, four zone hydrogen belt furnace with a two inch wide belt manufactured by the Lindberg Company of Milwaukee, Wis. was used to melt the solder paste, but such furnace is not essential. Means and methods for melting solder pastes under controlled atmospheres are well known in the art.

Alignment means 52, 62 are designed to have a larger mutually solder wetted periphery than between die bond pad 22 and attachment means 66, or between die 16 and die flag 13. This insures that the surface tension force aligning clip 60 into groove 52 of lead 50 will predominate. Thus, clip 60 tends to automatically center on lead 50 and, because of alignment groove or depression 52, point directly toward the center of die flag 13.

Because die flag 13 is substantially covered (and wetted) by solder 20, die 16 has no singular preferred location on flag 20 and can skate to any part of the solder wetted area where it still rests on solder, i.e., not hanging over an edge. Die 16 is substantially mobile within the solder wetted area on flag 13 so long as the solder is liquid.

During solder melting, attachment means 66 on clip 60 and die bond pad 22 are joined by liquified solder 58. Because the portion 66 of clip 60 in proximity to pad 22 is slightly smaller than pad 22 and because region 66 is bent up away from pad 22 toward its periphery, die pad 22 and attachment region 66 tend to self-align, that is, align themselves so that attachment region 66 is centered over pad 22.

Since clip 60 is restrained by alignment means 52, 62 and the surface tension forces therebetween, it tends to remain centered on lead 50 while die 60 skates on die bond region 13 to center pad 22 under attachment means 66. Thus, the cooperative action of die 16, clip 60 and lead 50, coupled with the liquid state of bonding materials 20, 56 and 58 which float die 16 and clip 60, produces automatic self-alignment of the several parts. This is illustrated in 120E.

Self alignment occurs rapidly after liquification of the bonding materials. Thereafter the assembly is cooled to freeze the bonding materials, thereby electrically connecting the parts and preserving their alignment.

At 120F, molding of encapsulation material 130 over the assembled parts is illustrated. This is conventional and well known in the art. Following encapsulation, dam bars 122, 124 and rails 128 are sheared away to obtain the completed unit. Such operations are conventional.

It was found to be desirable to slightly agitate the parts during the solder melting operation to facilitate the floating and skating action which, combined with the surface tension forces and alignment means, produces the automatic self-alignment. The agitation amount need not be large. The vibration imparted by the moving metal belt of the solder reflow furnace was found to be sufficient.

While the die attachment step illustrated at 120B-C is shown as utilizing a solder paste that substantially covers die flange 13, but this is not essential. Good results are also obtained by placing a centrally located drop of solder paste on die flag 13 which is then pressed out laterally when die 16 is applied thereto. However, with this procedure, greater care must be taken to centrally locate the solder paste and die on flag 13 since the area over which die 16 may skate during solder melting and automatic alignment is reduced by any reduction in the solder wetted area on flag 13.

It will be appreciated based on the description herein that alignment means on the lead and connection clip which prevent horizontal (azimuthal) rotation are preferred, since horizontal rotation of the clip would reduce the tendency for the die bond end of the clip to align with the center of the die flag. Thus, the arrangements of FIGS. 3–7 are preferred compared to that of FIGS. 8–9 so far as the type of alignment means is concerned. All of the invented structures permit vertical rotation of the connection clip with respect to the leads and die, which is desirable to accommodate variations in die thickness or other variations in the elevation of bonding pad 22 and alignment means 32, 52, 72, or 92.

Having thus described the invention it will be apparent to those of skill in the art that the invented means and method provides an improved, self-aligning device structure having the die centered on the die flag, the connecting lead centered on the bonding pad, and the connecting lead aligned with the external lead of the package. This reduces manufacturing defects and improves reliability since more consistent solder joints are obtained.

Further, the self-centering action between the die pad and the connecting lead improves the surge capabilities of the device. Ordinarily, the lead to be connected to the bonding pad on the die must be made smaller than the bonding pad to insure that it does not, through misalignment for example, touch the surrounding dielectric. Because the device self-centers, less alignment tolerance need be provided between the bonding pad on the die and the lead to be attached thereto. Thus, the connecting lead portion may be made larger as compared to non-self-centering arrangements. This permits a comparatively large amount of high conductivity metal (e.g., the copper connecting lead) to be in close proximity with the contact pad and good solder filling of the pad-lead contact region, without allowing solder flow onto the adjacent dielectric on the chip. This combination improves the surge resistance without increasing the probability of die shorts due to solder creep.

Further, the vertical motion of the connection clip permitted by the invented arrangement improves manufacturing tolerance.

In addition, those of skill in the art will appreciate based on the description herein that many modifications and variations may be made in the invention which utilize the teachings and elements presented herein. Accordingly, it is intended to include all such modifications, variations and equivalents in the claims that follow.

We claim:

1. An electronic device comprising:
   an electronic chip having a first surface for attachment to a lead means and a second surface with a bonding pad thereon for receiving a connection means;
   lead means having a horizontal first portion for receiving the electronic chip and a second portion including a first alignment means for alignment of the connection means; and
   connection means for connecting the second portion of the lead means to the electronic chip, wherein the connection means has a first portion located vertically above the chip for coupling to the bonding pad and a second portion with a second alignment means which mates with the first alignment means for aligning the connection means between the second portion of the lead means and the bonding pad, wherein the mating first and second alignment means before being fixed together provide for some vertical but substantially no horizontal pivoting of the connection means.

2. The device of claim 1 further comprising first solder means between the bonding pad and the first portion of the connection means and second solder means between the first and second alignment means wherein the first and second solder means have a common melting temperature at which the connection means floats thereon.

3. The device of claim 2 further comprising third solder means between the electronic chip and the first portion of the lead means, wherein the first, second and third solder means have a common melting temperature.

4. The device of claim 1 further comprising a first attachment medium between the bonding pad and the first portion of the connection means, a second attachment medium between the first and second alignment means, and a third attachment medium between the electronic chip and the first portion of the lead means, wherein the first, second and third attachment media are of material which have a common liquification state at which the chip and connection means float on the attachment media.

5. An electronic device comprising:

an electronic chip having a first surface for attachment to a lead means and a second surface with a bonding pad thereon for receiving a connection means;

lead means having a first portion for receiving the electronic chip and a second portion including a first alignment means for alignment of the connection means; and connection means for connecting the lead means to the electronic chip, having a first portion for coupling to the bonding pad and a second portion with a second alignment means which mates with the first alignment means for aligning the connection means between the lead means and the bonding pad, wherein the first alignment means comprises a first depression and the second alignment means comprises a first protrusion mating with the first depression.

6. The device of claim 1 wherein the first alignment means comprises a first protrusion and the second alignment means comprises a first depression mating with the first protrusion.

7. The device of claim 1 wherein the mating alignment means, before being fixed together, facilitate some vertical pivoting and horizontal translation but substantially no horizontal pivoting of the connection means.

8. A semiconductor device, comprising:
a support member having a die bonding region;
a lead member comprising a first alignment means for aligning a separate connection means;
a semiconductor die mounted on the die bonding region wherein the semiconductor die has thereon a bonding pad for receiving part of the connection means;
connection means having a second alignment means and a connection region located proximate to the bonding pad; and
first solder means for coupling the bonding pad and the connection region and second solder means for coupling the mating alignment means wherein the mating alignment means facilitate, while the solder means are liquid, some rotation of the connection means in a direction perpendicular to the die but not in a direction parallel to the die.

9. The device of claim 8 further comprising a third solder means between the die and the die bonding region, wherein the first, second and third solder means have a common temperature wherein they are all at least partially liquid.

* * * * *